(12) United States Patent
Narukage

(10) Patent No.: US 11,956,956 B2
(45) Date of Patent: Apr. 9, 2024

(54) SEMICONDUCTOR STORAGE DEVICE AND MANUFACTURING METHOD OF THE SAME

(71) Applicant: Kioxia Corporation, Tokyo (JP)

(72) Inventor: Takeshi Narukage, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 308 days.

(21) Appl. No.: 17/198,410

(22) Filed: Mar. 11, 2021

(65) Prior Publication Data

US 2022/0020765 A1 Jan. 20, 2022

(30) Foreign Application Priority Data

Jul. 20, 2020 (JP) ................... 2020-123481

(51) Int. Cl.
*H10B 43/27* (2023.01)
*H10B 43/10* (2023.01)
*H10B 43/40* (2023.01)

(52) U.S. Cl.
CPC ............. *H10B 43/27* (2023.02); *H10B 43/10* (2023.02); *H10B 43/40* (2023.02)

(58) Field of Classification Search
CPC .................... H10B 41/20–27; H10B 43/20–27
See application file for complete search history.

(56) References Cited

U.S. PATENT DOCUMENTS

| | | | |
|---|---|---|---|
| 10,438,904 B2 | 10/2019 | Ito et al. | |
| 10,515,873 B2 | 12/2019 | Yoshimizu et al. | |
| 2019/0172794 A1* | 6/2019 | Ito | H10B 43/35 |
| 2019/0296117 A1 | 9/2019 | Ishiduki et al. | |
| 2020/0075461 A1 | 3/2020 | Yoshimizu et al. | |
| 2022/0328523 A1* | 10/2022 | Song | G11C 16/0483 |

FOREIGN PATENT DOCUMENTS

| | | |
|---|---|---|
| JP | 2017-147337 | 8/2017 |
| JP | 2018-152412 A | 9/2018 |
| JP | 2019-102685 A | 6/2019 |

\* cited by examiner

*Primary Examiner* — David Vu
(74) *Attorney, Agent, or Firm* — Oblon, McClelland, Maier & Neustadt, L.L.P.

(57) ABSTRACT

According to one embodiment, a semiconductor storage device is provided which includes a stacked body, a first pillar portion, a first separating portion, and a first supporting post. In the stacked body, a plurality of insulating layers and a plurality of electrically conductive layers are stacked alternately one on another. The stacked body is provided on a predetermined electrically conductive film. The first pillar portion includes a plurality of memory cells, and penetrates through the stacked body in a stacking direction of the stacked body. The first separating portion separates the stacked body into a plurality of blocks. The first supporting post extends locally within the stacked body from an upper surface of the predetermined electrically conductive film in the stacking direction.

1 Claim, 11 Drawing Sheets

US 11,956,956 B2

SEMICONDUCTOR STORAGE DEVICE AND MANUFACTURING METHOD OF THE SAME

CROSS-REFERENCE TO RELATED APPLICATIONS

This application is based upon and claims the benefit of priority from Japanese Patent Application No. 2020-123481, filed on Jul. 20, 2020; the entire contents of which are incorporated herein by reference.

FIELD

Embodiments described herein relate generally to a semiconductor storage device and a manufacturing method of the same.

BACKGROUND

Semiconductor storage devices having, for example, a three-dimensional memory structure include a stacked body where plural insulating layers and plural electrically conductive layers are stacked alternately one on the other, and plural pillar portions that penetrate through the stacked body where plural memory cells are formed respectively. Additionally, such semiconductor storage devices have separating portions that are formed to penetrate through the stacked body in order to divide areas where the plural pillar portions are formed, into blocks. The separating portion may also function as a through contact that connects an upper-layer line and a lower-layer line of the stacked body.

DETAILED DESCRIPTION

Figure 1:
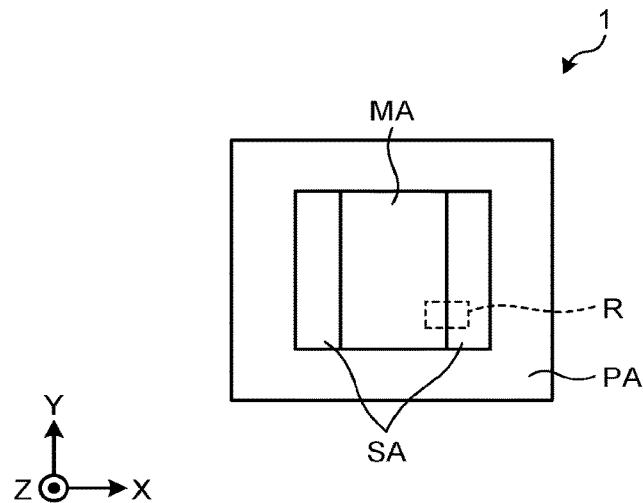
FIG. 1 is a top plan view schematically illustrating a semiconductor storage device according to one embodiment.

Some semiconductor storage devices have a three-dimensional memory structure including a stacked body, plural pillar portions, and plural separating portions. The stacked body has plural insulating layers and plural electrically conductive layers that are stacked alternately one on the other. The plural pillar portions penetrate through the stacked body and provide plural memory cells. The plural separating portions penetrate through the stacked body and divide areas, where the plural pillar portions are formed, into groups. When forming the separating portion, the separating portion tends to be wider near the upper end thereof, and narrower toward the lower end thereof, due to process constraints. Such a tendency becomes more remarkable when the number of layers stacked in the stacked body is increased in order to increase a memory capacity, which allows the separating portion to have a larger height. Additionally, a similar situation also occurs in the pillar portions. When a distance between the separating portion and the pillar portion is set so that wider portions of the separating portion and the pillar portion are prevented from being in contact with each other, the distance becomes rather wider between narrower portions of the both. Electrically conductive layers are formed by removing sacrificial layers after plural insulating layers and plural sacrificial layers are stacked alternately one on the other, and filling a conductive material into spaces formed by removing the sacrificial layers. Here, when the sacrifice layers are removed, the remaining insulating layers may be warped (or drooped down) when the distance is too wide between the narrow portions of the separating portion and the pillar portion, which may arise a situation where the conductive material cannot be filled into the spaces formed by removing the sacrificial layers.

On the other hand, when the distance between the separating portion and the pillar portion is narrowed in order to circumvent such a situation, the wider portions of the both may be in contact with each other, which may cause electrical short therebetween. Namely, it is rather difficult to prevent the wider portions of the separating portion and the pillar portion from being in contact with each other in a higher portion of the stacked body, while preventing the insulating layers from being warped in a lower portion of the stacked body.

Regarding a semiconductor storage device having plural pillar portions, which penetrate through a stacked body where plural insulating layers and plural electrically conductive layers are stacked alternately one on the other, and separating portions that divide the plural pillar portions into groups, one embodiment of this disclosure provides the semiconductor storage device and a manufacturing method of the same which allow the electrically conductive layers to be appropriately formed in a lower portion of the stacked body, while circumventing the separating portion and the pillar portion from being in contact with each other.

According to one embodiment, a semiconductor storage device is provided which includes a stacked body, a first pillar portion, a first separating portion, and a first supporting post. In the stacked body, a plurality of insulating layers and a plurality of electrically conductive layers are stacked alternately one on another. The stacked body is provided on a predetermined electrically conductive film. The first pillar portion includes a plurality of memory cells, and penetrates through the stacked body in a stacking direction of the stacked body. The first separating portion separates the stacked body into a plurality of blocks. The first supporting post extends locally within the stacked body from an upper surface of the predetermined electrically conductive film in the stacking direction.

Non-limiting, exemplary embodiments of the present invention will now be described with reference to the accompanying drawings. In the drawings, the same or corresponding reference marks are given to the same or corresponding members or components, and redundant explanations will be omitted. It is to be noted that the drawings are illustrative of the invention, and there is no intention to indicate scale or relative proportions among the members or components, or between thicknesses of various layers. Therefore, the specific thickness or size should be determined by a person having ordinary skill in the art in view of the following non-limiting embodiments.

FIG. 1 is a top plan view schematically illustrating a semiconductor storage device according to one embodiment. As illustrated, a semiconductor storage device 1 has a memory area MA, stair areas SA, and a peripheral area PA. The memory area MA is provided with plural memory cells, and the stairs areas SA are provided with electrically conductive portions electrically connected to respective ones of the plural memory cells in the memory area MA. The peripheral area PA is provided with circuits and the like that control the memory cells.

Figure 2:
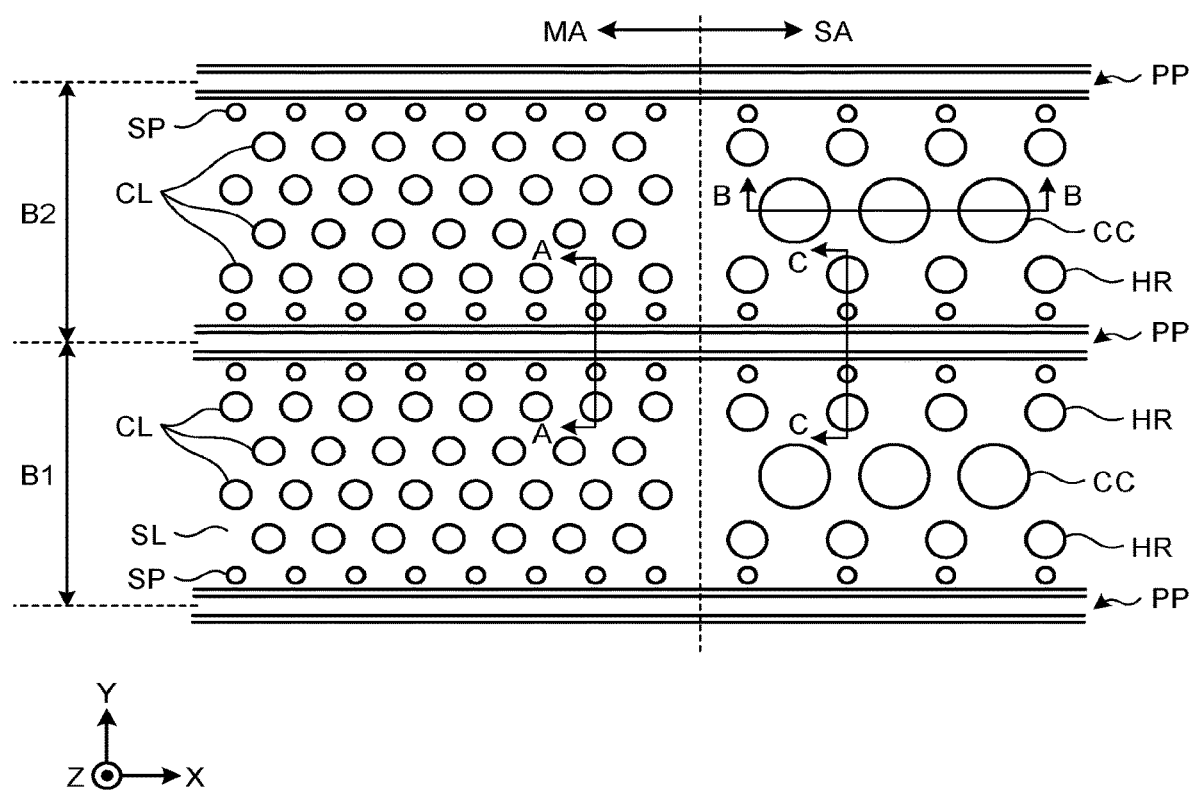
FIG. 2 is a partially enlarged view of a memory area and a stair area of the semiconductor storage device according to the embodiment.
Figure 3:
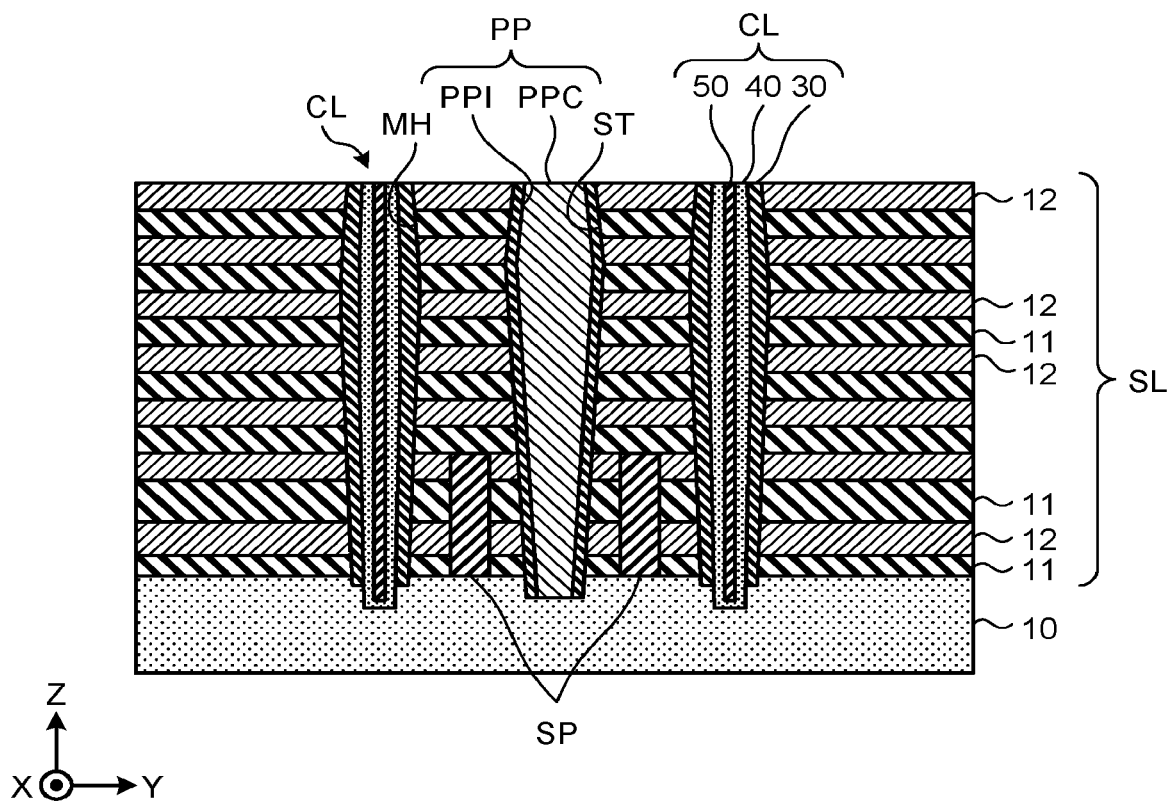
FIG. 3 is a schematic cross-sectional view taken along an A-A line in FIG. 2.
Figure 4:
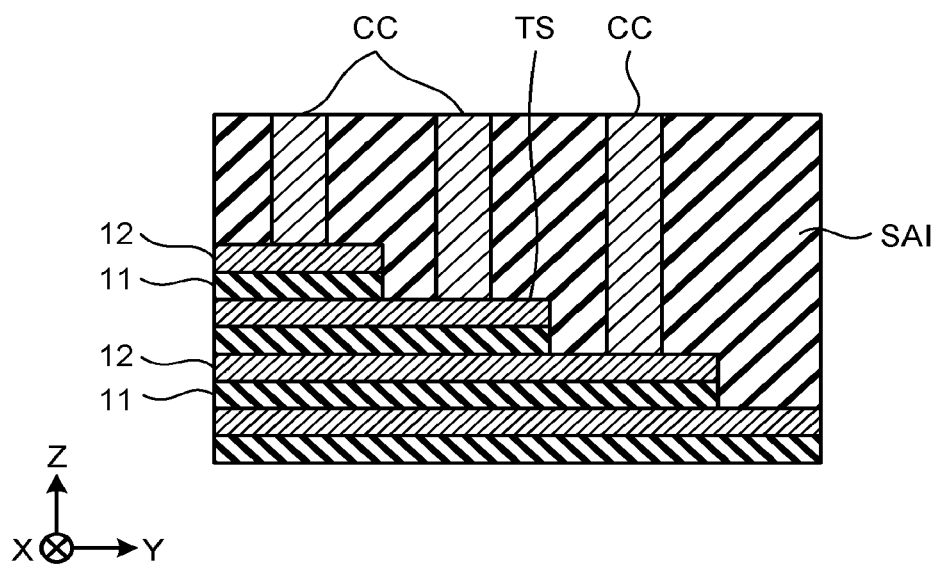
FIG. 4 is a schematic cross-sectional view taken along a B-B line in FIG. 2.

FIG. 2 is a partially enlarged view of the memory area MA and the stair area SA of the semiconductor storage device 1, and corresponds to a portion R in FIG. 1. FIG. 3 is a schematic cross-sectional view taken along an A-A line in FIG. 2; and FIG. 4 is a schematic cross-sectional view taken along a B-B line in FIG. 2. Note that an upper-layer line (bit line and the like) connected to a first pillar portion CL (described later) is not illustrated.

Referring to FIG. 2, the memory area MA has a stacked body SL, plural first pillar portions CL, and separating portions PP. The stacked body SL is formed on a base body 10 as illustrated in FIG. 3, and has plural insulating layers 11 and plural electrically conductive layers 12 stacked alternately one on the other. The base body 10 is electrically conductive and may be, for example, a silicon substrate or a monocrystalline silicon layer deposited on the silicon substrate.

The plural first pillar portions CL are arranged next to one another in an X-direction, as illustrated in FIG. 2, and arranged staggered along a Y-direction orthogonal to the X-direction. Additionally, as illustrated in FIG. 3, the first pillar portions CL penetrate through the stacked body SL from an upper surface of the stacked body SL, and are formed by being filled into through-holes MH that reach the base body 10. Each of the first pillar portions CL has a memory film 30, a silicon film 40, and a core film 50 (see FIG. 3). Here, a portion where the lowermost one of the electrically conductive layers 12 of the stacked body SL is in contact with the first pillar portion CL functions as a source select transistor. Another portion where the uppermost one of the electrically conductive layers 12 is in contact with the first pillar portion CL functions as a drain select transistor. The other portions where the rest of the electrically conductive layers 12 (word lines) are in contact with the first pillar portions CL function as memory cells.

The separating portions PP extend in the X-direction, as illustrated in FIG. 2, to divide the memory area MA into plural blocks B1, B2, • • •. As illustrated in FIG. 3, the separating portions PP are formed within the slits ST that penetrate through the stacked body SL from the upper surface thereof and reach an inside of the base body 10. Additionally, each of the separating portions PP has an insulating film PPI that covers the inner side surfaces of the slit ST, and an electrically conductive portion PPC filled inside the insulating film PPI. The electrically conductive portion PPC is connected to the base body 10, and thus electrically connected to the base body 10 and an unillustrated upper electrode.

As illustrated in FIG. 2, the stair area SA has contacts CC, second pillar portions HR, and the separating portions PP. Additionally, in the stair area SA, the electrically conductive layers 12 having different lengths are stacked with the insulating layer 11 interposed between the two vertically adjacent electrically conductive layers 12, as illustrated in FIG. 4. Each of the electrically conductive layers 12 continually extends from the stacked body SL to the stair area SA. Here, any one of the electrically conductive layers has a shorter extending length than the electrically conductive layer 12 one layer below. Namely, in the stair area SA, the plural electrically conductive layers 12 are formed in a shape of stairs that ascend in a direction from the stair area SA to the memory area MA. The contacts CC extending from the upper surface of the stacked body SL are connected to the corresponding terrace surfaces TS (or treads of stairs) of the plural electrically conductive layers 12 formed in the shape of stairs.

The contacts CC, which are electrically conductive, may include metal, such as tungsten. The contacts CC are connected to the unillustrated upper-layer line (word line). The upper-layer line is electrically connected to the circuit portion provided in, for example, the peripheral regions PA (FIG. 1). A predetermined voltage is applied to the memory cells through the contacts CC and the electrically conductive layers 12, and thus the memory cells are controlled.

Note that an insulating body SAI is formed above the terrace surfaces TS to insulate the electrically conductive layers 12 from the unillustrated upper-layer line, and every two adjacent contacts CC are insulated.

Second pillar portions HR (FIG. 2) are formed by filling an insulating material into the holes formed to penetrate through the insulator SAI and the electrically conductive layers 12 formed in the shape of stairs. The second pillar portions HR are used to support the plural insulating layers 11 when the electrically conductive layers 12 are formed. Additionally, as illustrated in FIG. 2, the separating portion PP (slits ST) extend continuously from the memory area MA to the stair area SA.

In both the memory area MA and the stair area SA, plural supporting posts SP are provided along the separating portions PP, as planar positions thereof are illustrated in FIG. 2. In this embodiment, the supporting posts SP are provided between the first pillar portion CL and the separating portion PP, and between the second pillar portion HR and the separating portion PP. More specifically, the supporting posts SP may be placed along a straight line that is orthogonal to the separating portion PP and passes through the first pillar portions CL (the second pillar portions HR in the stair area SA). Additionally, the supporting post SP may be arranged in a middle point between the separating purport PP and the first pillar portion CL (the second pillar portions HR in the stair area SA). Alternatively, the supporting post SP may be arranged closer to the separating portion PP than the middle point, or closer to the first pillar portion CL (the second pillar portions HR in the stair area SA) than the middle point.

Additionally, the supporting posts SP do not penetrate throughout the stacked body SL, but are provided in a lower portion of the stacked body SL, as illustrated in FIG. 3. In other words, the supporting posts SP extend from an upper surface of the base body 10 locally into the stacked body SL. A height of the supporting post SP may be arbitrarily determined based on the number of layers stacked in the stacked body SL, and on a distance between the first pillar portion CL and the separating portion PP. Moreover, a distance between the second pillar portion HR and the separating portion PP may be taken into consideration when the height of the supporting post SP is determined. Furthermore, a length of the supporting post SP along a direction parallel with the separating portions PP (the X-direction) and a length of the supporting post SP along another direction orthogonal to the separating portions PP (the Y-direction) may also be arbitrarily determined. Additionally, because the separating portion PP tends to be wider at an upper portion thereof and narrower at a lower portion thereof, as described later, taking such a shape into consideration, a shape and position of the supporting post SP may be determined.

Next, referring to FIGS. 5 to 15, an explanation is made on a manufacturing method of the semiconductor storage device 1 according to the embodiment. FIGS. 5 to 15 are schematic cross-sectional views of the memory area MA after steps, chosen for the sake of explanation, in the manufacturing method of the semiconductor storage device 1 according to the present embodiment. In the following, the manufacturing method is described focusing on the memory area MA.

Figure 5:
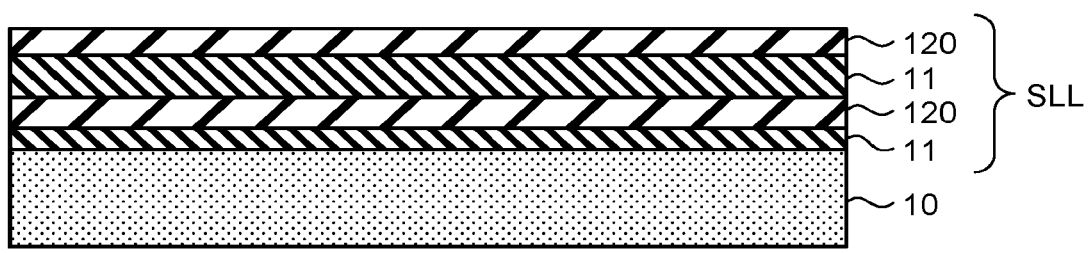
FIG. 5 is a cross-sectional view schematically illustrating a memory area of the semiconductor storage device according to the present embodiment in a manufacturing method thereof.

First, as illustrated in FIG. 5, a lower portion SLL of the stacked body SL is formed on the base body 10. The lower portion SLL has plural insulating layers 11 and plural sacrificial layers 120 stacked alternately one on the other. The sacrificial layer 120 is exposed on an upper surface of the lower portion SLL. The sacrificial layers 120 may be formed of, for example, silicon nitride, and the insulating layers 11 may be formed of, for example, silicon oxide. Note that, in the illustrated example, the lower portion SLL has two insulating layers 11 and two sacrificial layers 120. Without limiting to this, the number of layers in the lower portion SLL may be determined in accordance with a height of the supporting posts SP to be formed, because the height is determined by the number of layers in the lower portion SLL.

Figure 6:
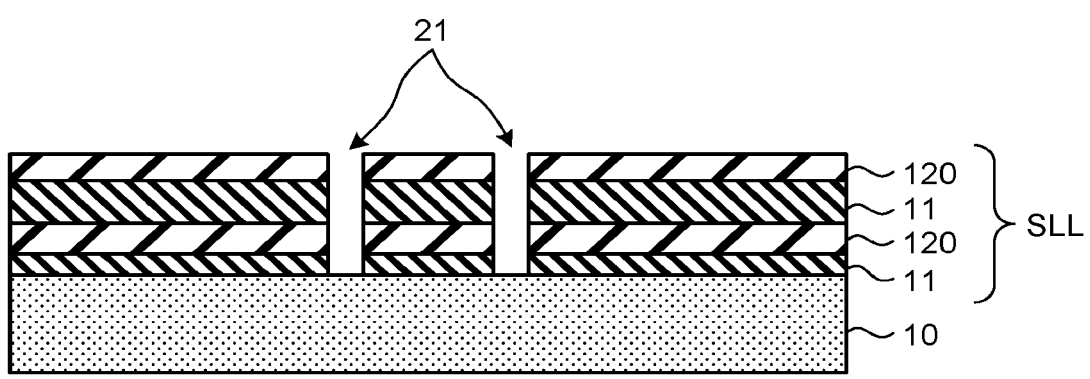
FIG. 6 is a cross-sectional view schematically illustrating the memory area in the manufacturing method, subsequent to FIG. 5.

Next, as illustrated in FIG. 6, holes 21 are formed which penetrate through the lower portion SLL and reach the upper surface of the base body 10. Specifically, a photoresist layer (not illustrated) is first formed on the upper surface of the lower portion SLL. The photoresist layer has openings in predetermined positions where the holes 21 are to be formed. Using the photoresist layer as a mask, the lower portion SLL is etched by, for example, a reactive ion etching (RIE) method. Here, the base body 10 functions as an etching stopper, and thus is exposed on a bottom surface of the hole 21.

Figure 7:
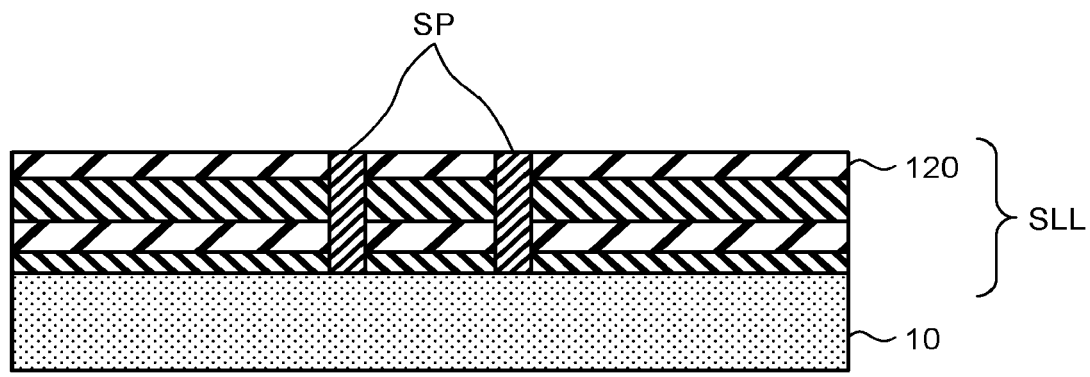
FIG. 7 is a cross-sectional view schematically illustrating the memory area in the manufacturing method, subsequent to FIG. 6.

Subsequently, the holes 21 are filled with, for example, silicon oxide, and thus the supporting posts SP are formed as illustrated in FIG. 7. Specifically, the holes 21 are first filled with silicon oxide by a plasma chemical vapor deposition (CVD) method and the like using, for example, tetraethoxysilane (TEOS) as a source material. At this time, silicon oxide may be deposited seamlessly or conformal to the holes 21 so that voids are not formed within the supporting posts SP. After the holes 21 are filled with silicon oxide, a silicon oxide film remaining on the upper surface of the lower portion SLL is removed by, for example, a chemical mechanical planarization (CMP) method or an etched back method. With this, the supporting posts SP are formed, and an uppermost one of the sacrificial layers 120 is exposed.

Next, the plural insulating layers 11 and the plural sacrificial layers 120 are stacked alternately one on the other on the upper surface of supporting posts SP and the lower portion SLL, and thus the stacked body SL is obtained which includes the lower layer portion SLL. Steps until here are applied to both the memory area MA and the stair area SA, and thus the same structures are formed in both areas MA, SA. Then, in the stair area SA, the stacked body SL is etched locally into a shape of stairs where the sacrificial layers 120 are exposed as terrace surfaces TS (see FIG. 4). In such etching, a mask layer having the shape of stairs formed by an imprint method may be used. Alternatively, the stacked body SL is etched into the shape of stairs, while shrinking a photoresist mask layer formed on the stacked body SK.

Then, the insulating body SAI (FIG. 4) is formed on the stacked body SL having the shape of stairs. The insulating body SAI may be formed of, for example, silicon oxide, by a plasma CVD method using TEOS as a source material. An upper surface of insulating body SAI is coplanar with an upper surface of the stacked body SL in the memory area MA.

Figure 8:
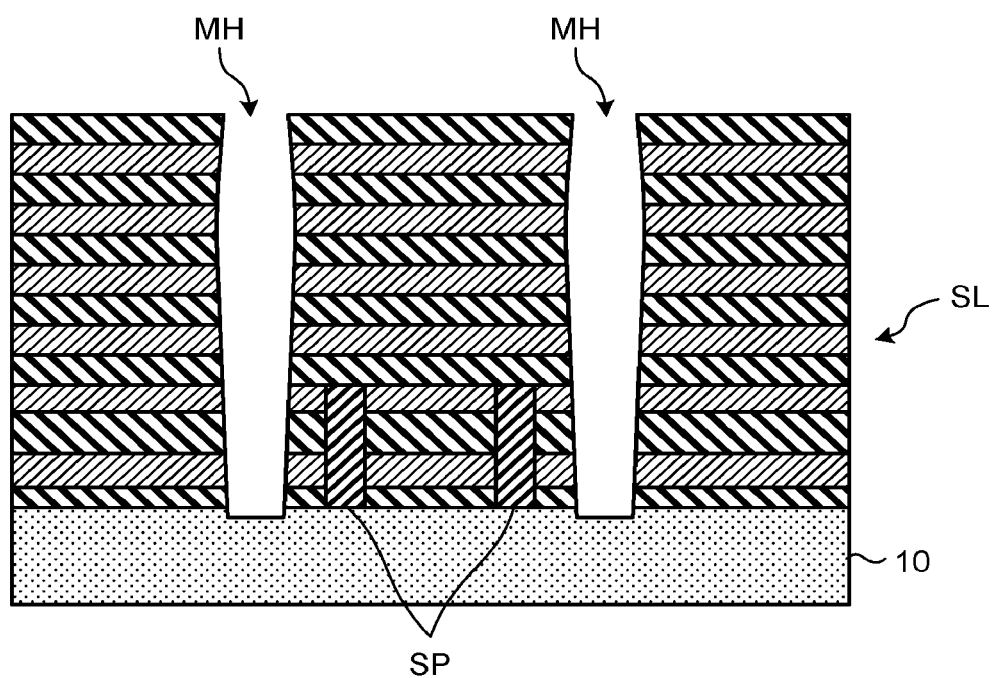
FIG. 8 is a cross-sectional view schematically illustrating the memory area in the manufacturing method, subsequent to FIG. 7.

Next, the through-holes MH are formed in the memory area MA. The through-holes MH penetrate through the stacked body SL in the stacking direction, and reach the base body 10, as illustrated in FIG. 8. Specifically, first, a photoresist layer (not illustrated), which has openings at positions where through-holes MH are to be formed, is formed on the upper surface of the stacked body SL. Then, the stacked body SL is etched by the RIE method using the photoresist layer as a mask. At this time, the base body 10 may also be etched, and in this case, recesses are formed in the upper surface of the base body 10. With this, the through-holes MH are formed.

Figure 9:
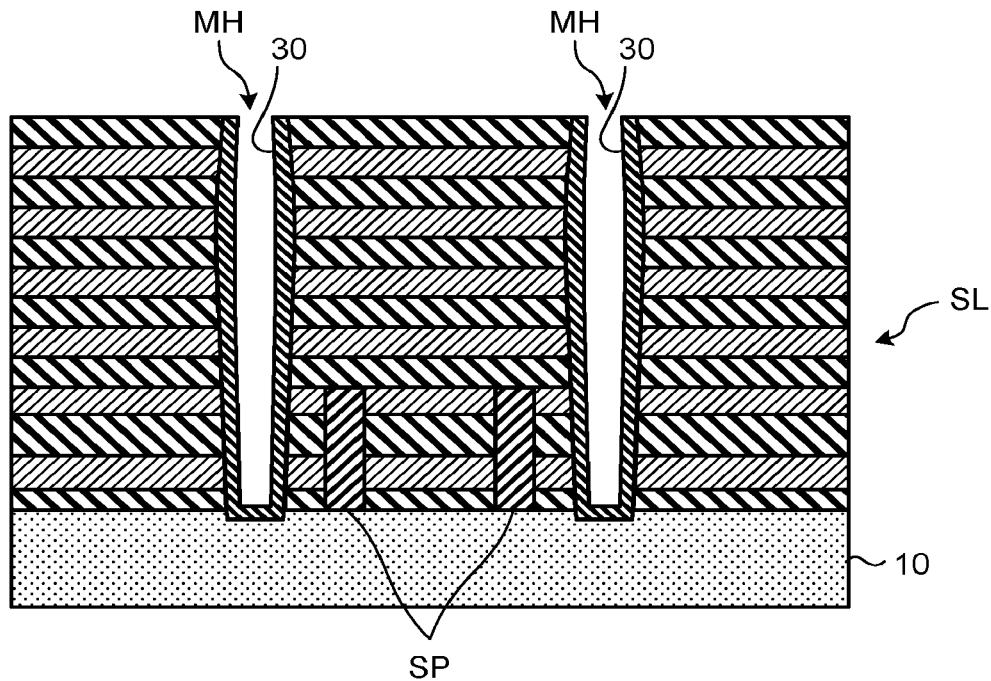
FIG. 9 is a cross-sectional view schematically illustrating the memory area in the manufacturing method, subsequent to FIG. 8.
Figure 10:
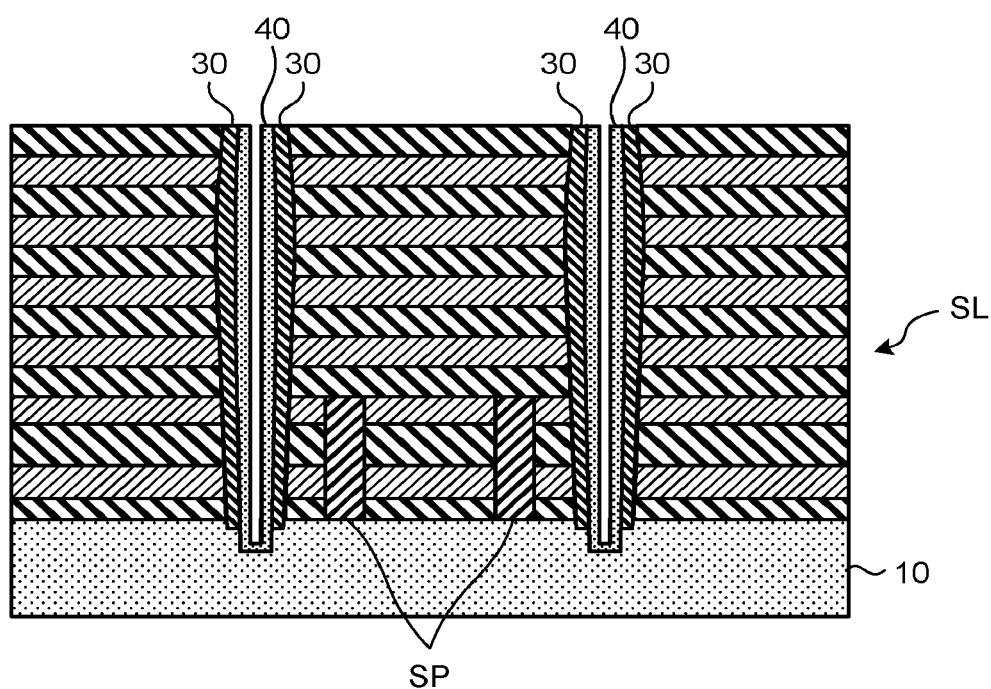
FIG. 10 is a cross-sectional view schematically illustrating the memory area in the manufacturing method, subsequent to FIG. 9.
Figure 11:
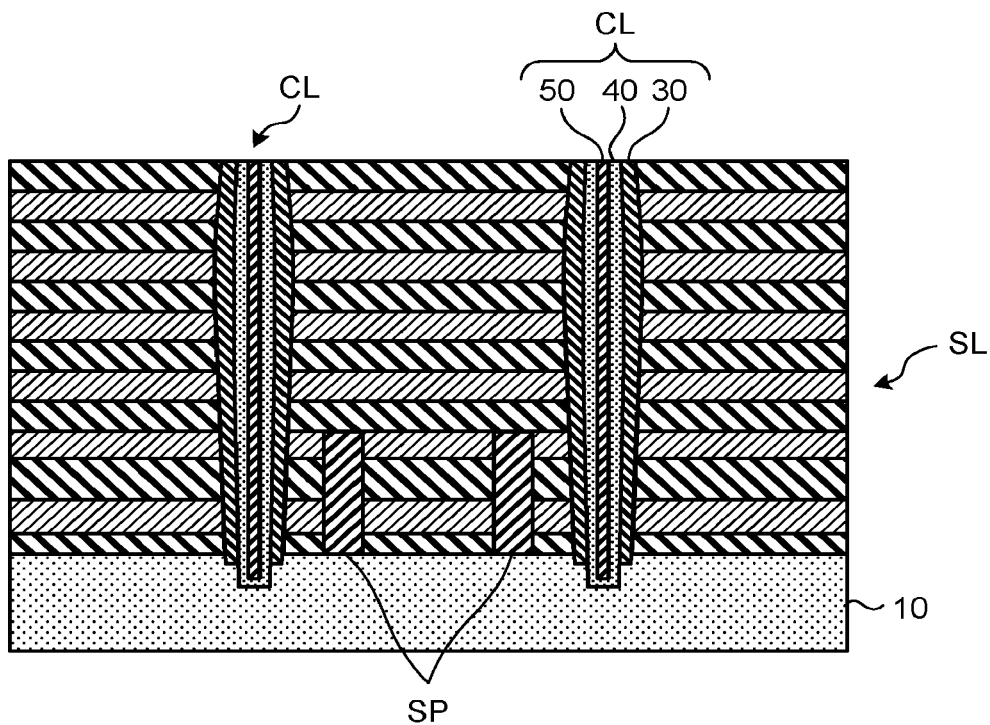
FIG. 11 is a cross-sectional view schematically illustrating the memory area in the manufacturing method, subsequent to FIG. 10.

Subsequently, the first pillar portions CL are formed in the corresponding through-holes MH. Specifically, first, the memory films 30 are formed on inner surfaces of the through-holes MH, as illustrated in FIG. 9. The memory films 30 can be formed by, for example, an atomic layer deposition (ALD) method. According to the ALD method, the memory films 30 can be formed conformal to the inner surfaces (inner side surfaces and bottom surfaces) of the through-holes MH. The memory films 30 each include a block insulating film deposited on the inner surfaces of through-hole MH, a charge accumulation film deposited on the block insulating film, and a tunnel insulating film deposited on the charge accumulation film.

The block insulating film may be formed of, for example, silicon oxide. The block insulating film prevents an electric charge accumulated in the charge accumulation film from being released to the electrically conductive layer 12. Additionally, the block insulating film prevents back tunneling of the electric charge from the electrically conductive layer 12 to the first pillar portion CL.

The tunnel insulating film may be formed of, for example, silicon oxide. When an electric charge is injected into the charge accumulation film from the silicon film 40 (FIG. 3) serving as a channel, or when an electric charge accumulated in the charge accumulation film is released to the silicon film 40, the tunnel insulating film functions as an electric potential wall. Note that the charge storing film may be formed of, for example, silicon nitride.

After the memory film 30 is formed, a portion of each of the memory films 30, the portion being on the bottom surfaces of the through-holes MH, is etched by the RIE method. Furthermore, the base body 10 becomes exposed by this etching and thus recesses are formed therein which extend from the through-holes MH.

After this, electrically conductive silicon is deposited conformal on the memory films 30 formed inside the through-holes MH by, for example, the ALD method, and thus the silicon film 40 is obtained which has a bottomed cylinder shape. Bottom ends of the silicon films 40 are located in the recesses of the base body 10, and thus the silicon films 40 are electrically connected securely to the base body 10.

Subsequently, the core films 50 are formed inside the silicon films 40. The core films 50 may be formed of, for example, silicon oxide. With all the above processes, the first pillar portions each including the memory film 30, the silicon film 40, and the core film 50 are formed in the through-holes MH.

After this, the second pillar portions HR (FIG. 2) are formed in the stair area SA. Namely, holes are formed in predetermined positions by the RIE method, the holes penetrating through the stair area SA (the insulating body SAI and the stacked body SL having a shape of stairs) to reach the base body 10. Then, these holes are filled with, for example, silicon oxide by a CVD method, and thus the second pillar portions HR are obtained.

Figure 12:
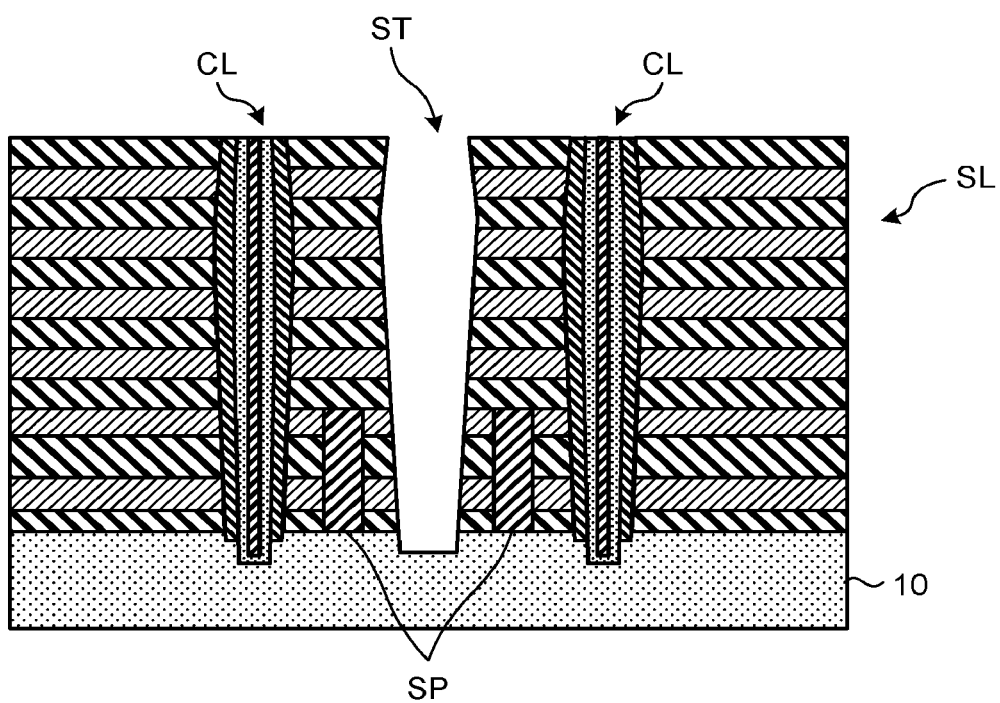
FIG. 12 is a cross-sectional view schematically illustrating the memory area in the manufacturing method, subsequent to FIG. 11.
Figure 13:
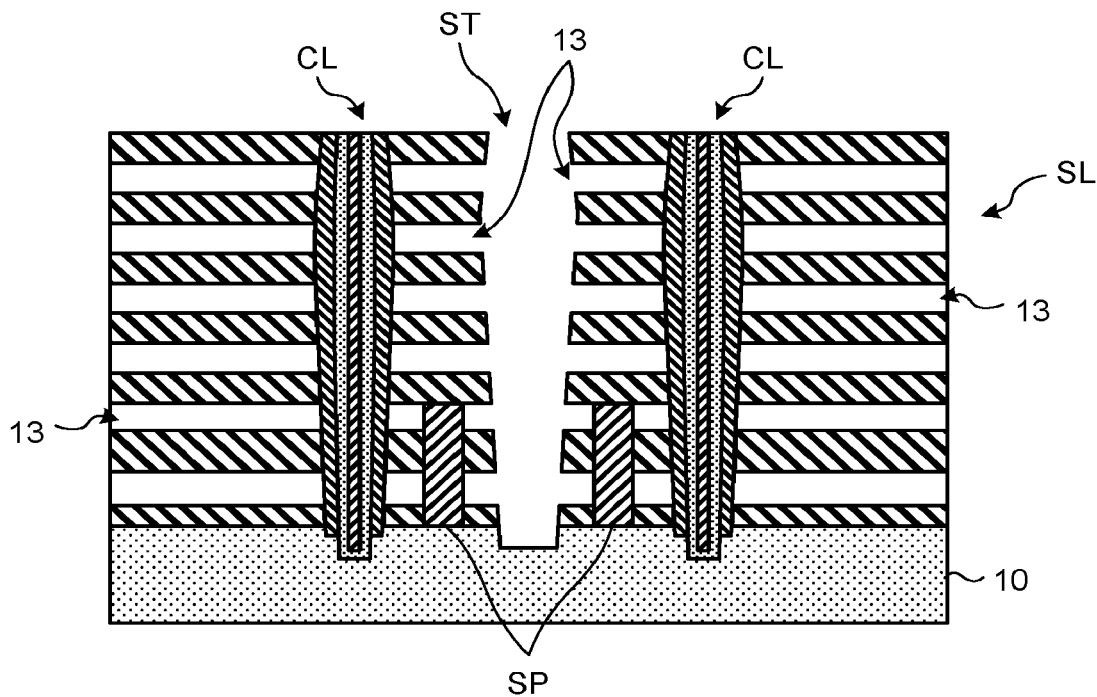
FIG. 13 is a cross-sectional view schematically illustrating the memory area in the manufacturing method, subsequent to FIG. 12.
Figure 14:
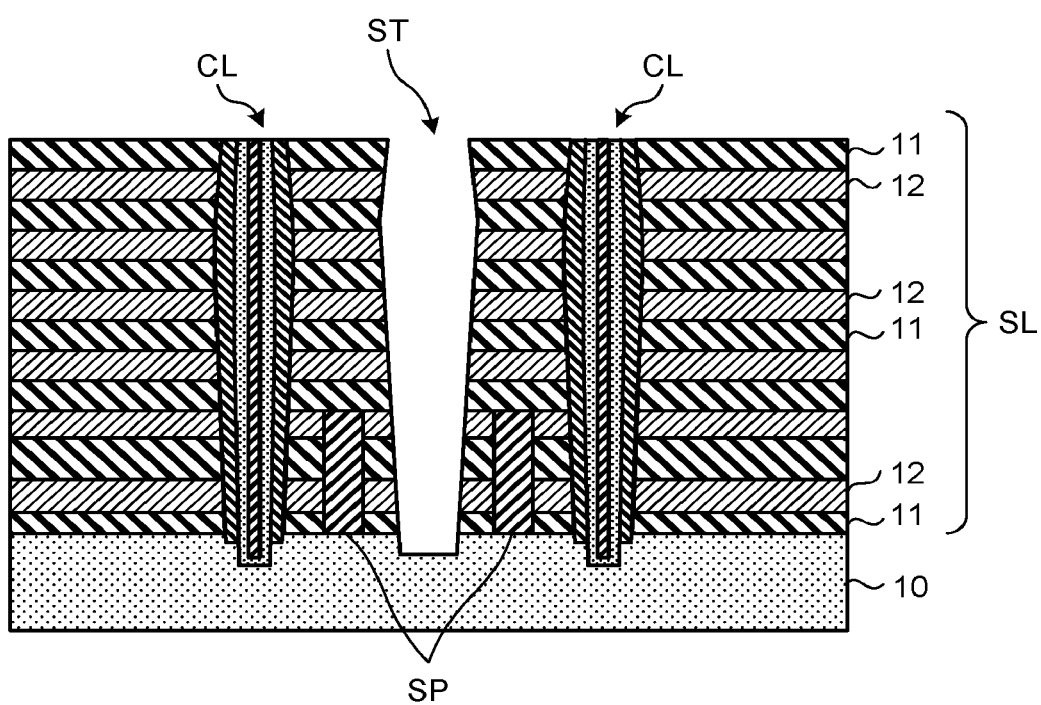
FIG. 14 is a cross-sectional view schematically illustrating the memory area in the manufacturing method, subsequent to FIG. 13.

Then, as illustrated in FIG. 12, the slits ST are formed. Specifically, the slits ST are formed by etching the stacked body SL (in the stair area SA, the insulating body SAI (FIG. 4) and the stacked body SL in the shape of stairs) by the RIE method using a predetermined photoresist layer (not illustrated) as a mask. At this time, an upper surface of the base body 10 is also etched, and thus recesses are formed in the base body 10. In other words, lower ends of the slits ST are defined by the corresponding recesses of the base body 10.

Note that, as illustrated in FIG. 2, the slits ST continuously extend in the X-direction from the memory area MA to the stair area SA.

Next, an etching solution is supplied into the slits ST, and thus the sacrificial layers 120 in the stacked body SL are removed. Because the sacrificial layers 120 are formed of silicon nitride in the present embodiment, the sacrificial layers 120 can be removed selectively when, for example, an etching solution containing phosphoric acid is supplied into the slits ST. Note that the sacrificial layers 120 may be removed selectively by a dry etching method using a predetermined etching gas.

When the sacrificial layers 120 are removed, spaces 13 are formed between two vertically adjacent ones of the insulating layers 11. Here, the plural insulating layers 11 are supported by the first pillar portions CL in the memory area MA, and thus the spaces 13 are maintained between two vertically adjacent ones of the insulating layers 11. Additionally, in a lower portion of the stacked body SL, some of the insulating layers 11 are supported also by the supporting posts SP. At least one effect brought about by the supporting posts SP is described later.

Then, the spaces 13 are filled with a conductive material, and thus the electrically conductive layers 12 are formed. Specifically, a source gas such as an organic metal gas and the like that contains tungsten is supplied into the spaces 13 through the slits ST by, for example, the ALD method, and thus tungsten is deposited in the spaces 13. In such a manner, the electrically conductive layers 12 are formed. With this, the stacked body SL has the plural insulating layers 11 and the plural electrically conductive layers 12 stacked alternately one on the other.

Note that the sacrificial layers 120 extend from the memory area MA to the stair area SA. In the stair area SA, the sacrificial layers 120 located lower have a longer extending length, and thus a shape of stairs is formed as a whole. Therefore, after the sacrificial layers 120 are removed, the spaces 13 extend also in the shape of stairs to the stair area SA. Accordingly, the electrically conductive layers 12 obtained by filling tungsten into the spaces 13 reflect the shape of the sacrificial layers 120 and thus have the shape of stairs (see FIG. 4). Note that, in the stair area SA, the insulating layers 11 are supported by the second pillar portions HR (FIG. 2), after the sacrificial layers 120 are removed, and the spaces 13 are thereby maintained between two vertically adjacent insulating layers 11. Additionally, as is the case with the memory area MA, the lower-layer insulating layers 11 are also supported by the supporting posts SP also in the stair area SA.

Figure 15:
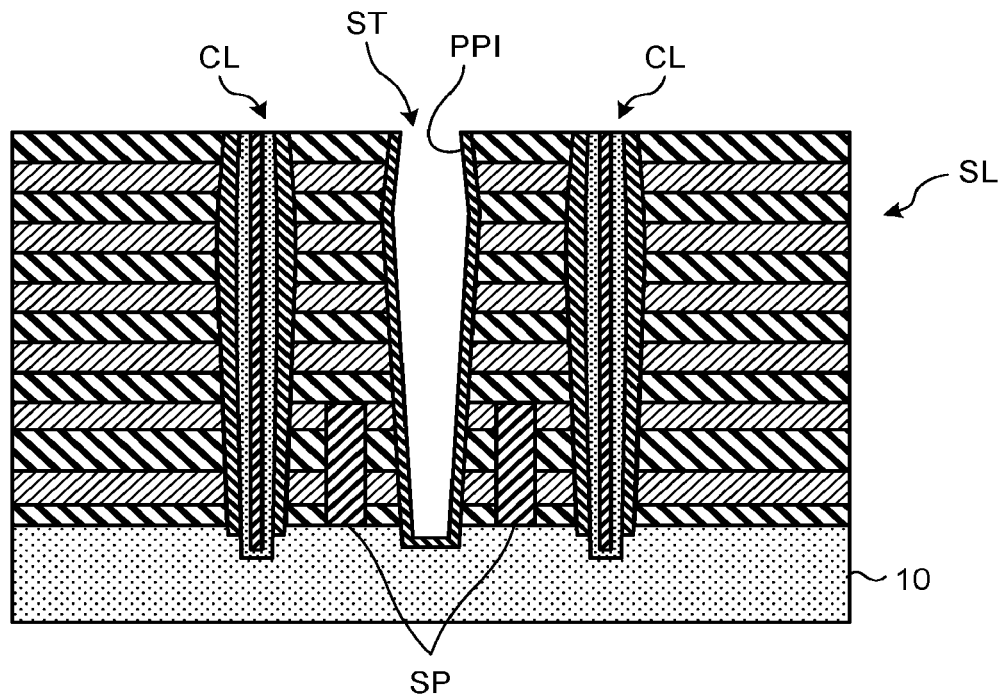
FIG. 15 is a cross-sectional view schematically illustrating the memory area in the manufacturing method, subsequent to FIG. 14.

Then, after removing the metal which has been deposited on the inner side surfaces and the bottom surfaces of the slits ST at the time of forming the electrically conductive layers 12, the insulating films PPI are formed in the inner side surfaces and the bottom surfaces of the slits ST by the ALD method (FIG. 15). After portions of the insulating film PPI, the portions being on the bottom surfaces of the slits ST, are removed by the RIE method (see FIG. 3), a conductive material is filled into the slits ST, and thus the electrically conductive portions PPC are formed. The lower ends of the electrically conductive portions PPC are in physical and electrical contact with the base body 10.

After this, the contacts CC (FIGS. 1, 3) are formed. Specifically, a mask layer having openings in positions where the contacts CC are to be formed is formed on the upper surface of the stair area SA, and contact holes are formed by the RIE method using the mask layer. The contact holes reach the upper surface of each electrically conductive layer 12 from the upper surface of the stair area SA. Then, the contact holes are filled with, for example, a metal such as tungsten, and thus the contacts CC are obtained. With all the above processes, the semiconductor storage device 1 has been obtained.

Figure 16:
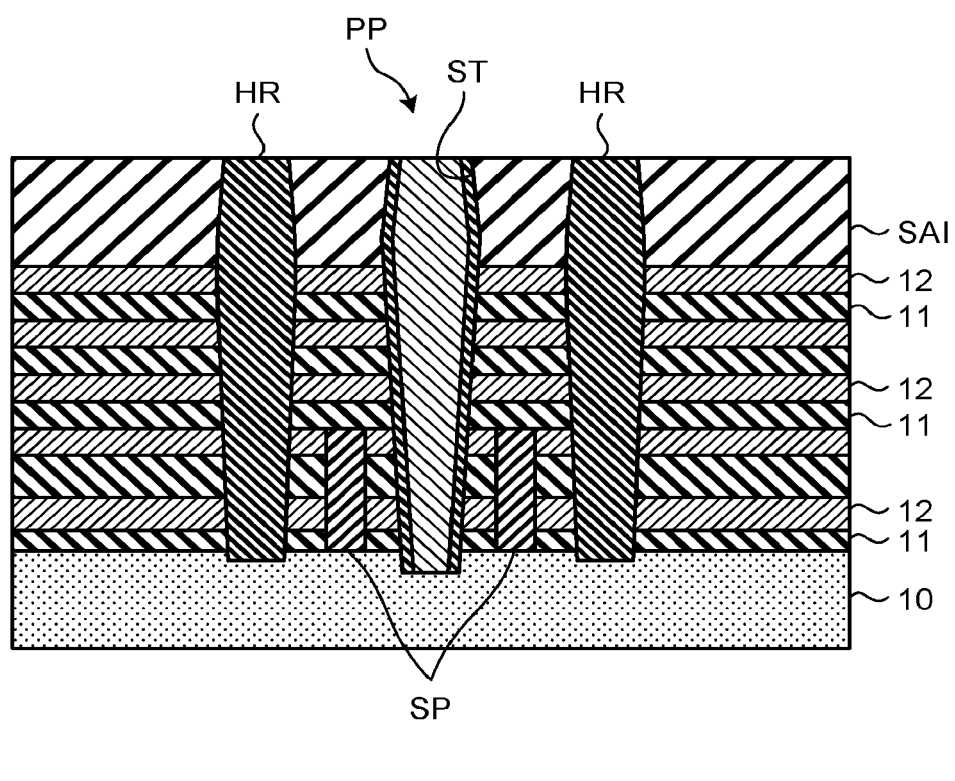
FIG. 16 is a schematic cross-sectional view of a stair area of the semiconductor storage device according to the embodiment.

Note that, in the stair area SA of the semiconductor storage device 1 according to the present embodiment, while the first pillar portions CL are not provided, the supporting posts SP are arranged between the second pillar portions HR and the separating portion PP (slit ST), as illustrated in FIG. 16. FIG. 16 is a schematic cross-sectional view taken along a C-C line in FIG. 2.

Figure 17:
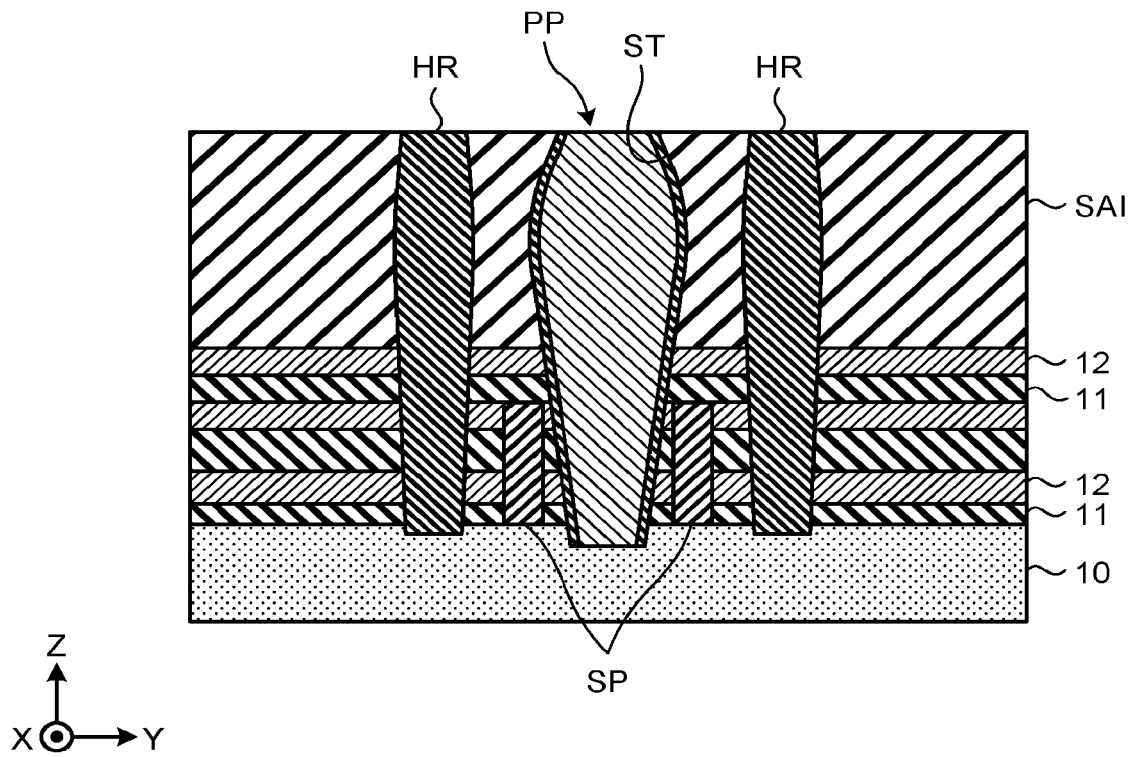
FIG. 17 is another schematic cross-sectional view of the stair area of the semiconductor storage device according to the embodiment.

Additionally, FIG. 17 is a schematic cross-sectional view of the second pillar portions HR located in a position farther away from the memory area MA in the stair area SA, in the same manner as FIG. 16. In such a position farther away from the memory area MA, there is the less number of the steps of the electrically conductive layers 12 in the shape of stairs, and instead, the insulating body SAI is thicker above the electrically conductive layers 12. In the position where the insulating body SAI is thicker, the position being farther away from the memory area MA, the slit ST tends to be wider. This is because an etch rate of the insulating body SAI formed of a single material (e.g., silicon oxide) is greater than an etch rate of the stacked body SL having the insulating layers 11 and the sacrificial layers 120. When a width of the slit ST becomes larger, a distance between the slit ST and the supporting posts SP become narrower, which may arise a situation where the supporting post SP is in contact with the separating portion PP filled in the slits ST. However, short circuits hardly occur between the supporting post SP and the electrically conductive portion PPC of the separating portion PP because the supporting posts SP are formed of an insulating material. The same is true for the supporting pillars SP and the first pillar portion CL. Additionally, the supporting post SP may be in contact with the second pillar portion HR.

Figure 18:
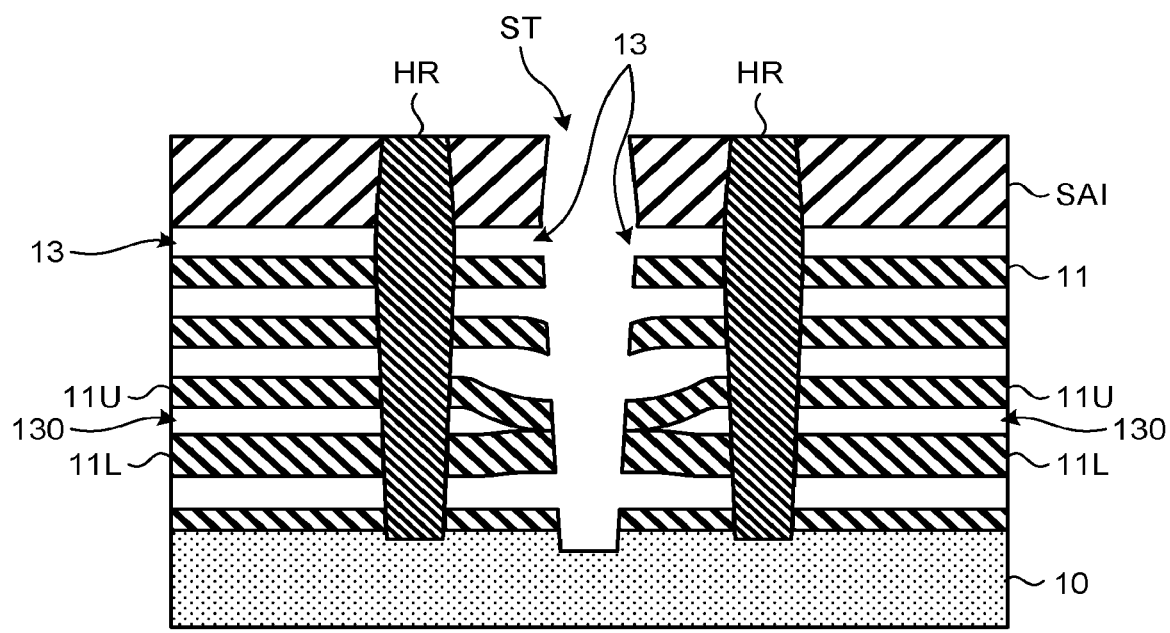
FIG. 18 is a schematic cross-sectional view of a memory area of a semiconductor storage device according to a comparative example.
Figure 19:
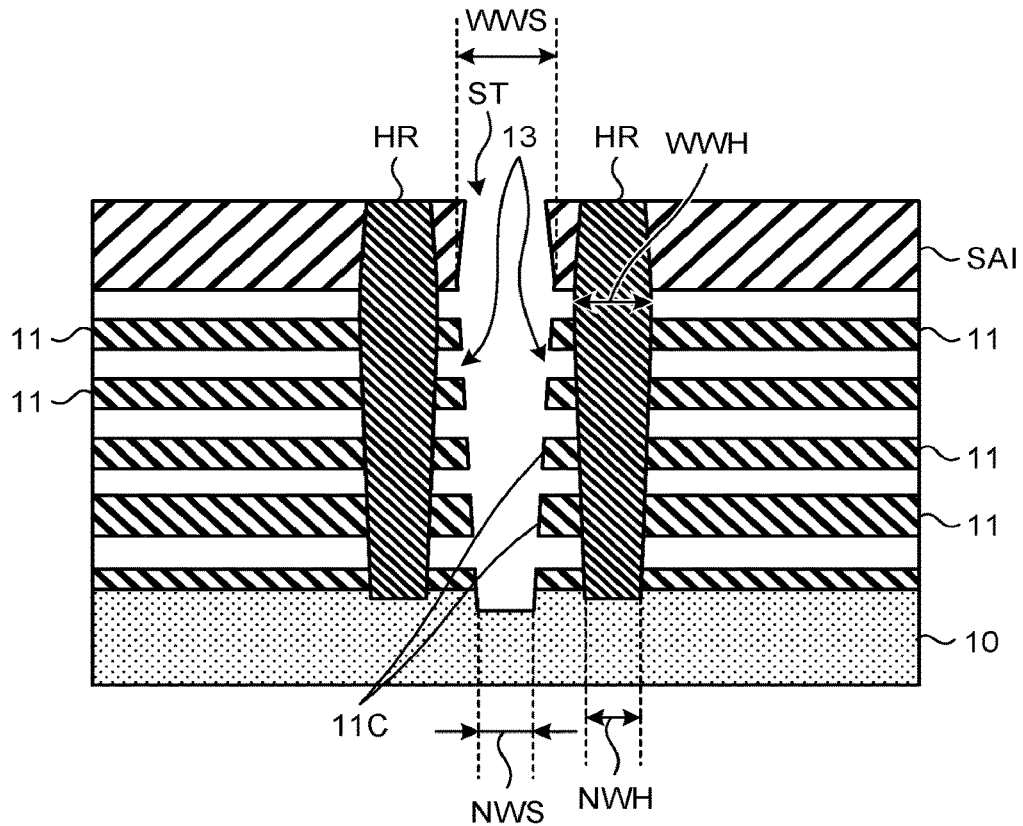
FIG. 19 is another schematic cross-sectional view of the memory area of the semiconductor storage device according to the comparative example.
Figure 20:
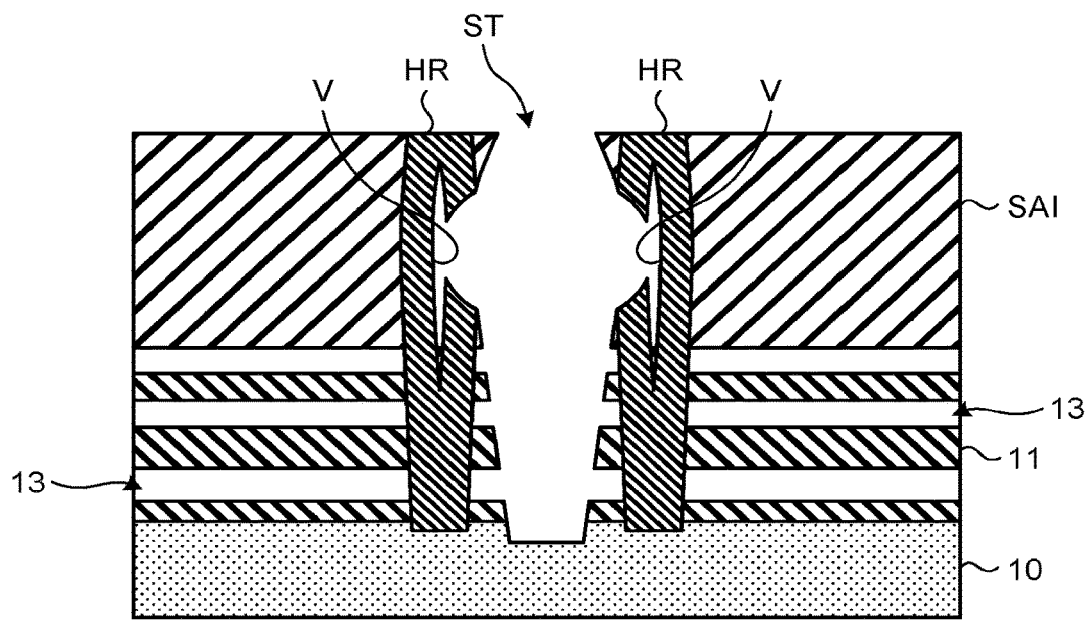
FIG. 20 is a schematic cross-sectional view of a stair area of the semiconductor storage device according to the comparative example.

Next, an explanation is made on an effect brought about by the semiconductor storage device 1 and a manufacturing method of the same, in comparison with a comparative example. Although a semiconductor storage device according to the comparative example does not have the supporting posts SP of the semiconductor storage device 1 according to the present embodiment, other structure except for this is the same as the semiconductor storage device 1. Additionally, the semiconductor storage device according to the comparative example can be manufactured if process steps are omitted which relate to forming the supporting post SP in the manufacturing method of the semiconductor storage device 1 according to the present embodiment. FIGS. 18 to 20 are partial cross-sectional views of the stair area of the semiconductor storage device according to the comparative example, which correspond to the partial cross-sectional view obtained after the sacrificial layers 120 are removed in the manufacturing method of the semiconductor storage device 1 according to the present embodiment.

Referring to FIG. 18, because the sacrificial layers have been removed, the spaces 13 are formed between the insulating layers 11. Additionally, a portion of each of the electrically conductive layers 11, the portion extending toward the slit ST, is cantilevered by the second pillar portions HR. In this case, two vertically adjacent insulating layers 11U, 11L among the insulating layers 11 may be in contact at distal end portions thereof with each other, as illustrated. With such a contact, an electrically conductive material cannot be introduced into the space 130 between the two insulating layers 11U, 11L, and thus no electrically conductive layer is formed between the insulating layers 11U, 11L.

In order to avoid such a situation, a distance between the slit ST and the second pillar portion HR may be decreased, for example, as illustrated in FIG. 19. In this case, because cantilevered portions 11C can be shorter, the portions 11C become hardly warped, and thus every two vertically adjacent insulating layers 11 are prevented from being in contact with each other.

However, when the distance between the slit ST and the second pillar portion HR is decreased, the slit ST may extend to the second pillar portion HR (and both come into contact with each other) when the slit ST is formed. As illustrated, the slit ST tends to have a larger width WWS at an upper portion thereof and a smaller width NWS in the bottom end. This is because the upper portion is exposed to active species within an etching gas for a longer time and/or at a higher density when the slit ST is formed. Similarly, the second pillar portions HR tend to have a larger width at an upper portion thereof and a smaller width at the bottom end.

Because the slit ST and the second pillar portion HR have such a shape, the portion of the larger width WWS in the slit ST comes closer to the portion of the larger width WWH in the second pillar portion HR, although a sufficient distance is kept between lower portions of the slit ST and the second pillar portion HR. Then, depending on variations of the etching rate at the time of forming the slit ST, the slit ST may be in contact with the second pillar portion HR.

Because in a position in the stair area, the position being farther away from the memory area, the insulating body SAI is relatively thicker, the etching advances in a lateral direction at the time of forming the slit ST, and thus a width of the slit ST may become wider as mentioned above. Therefore, it is thought that the slit ST is more likely to be in contact with the second pillar portion HR. As illustrated in FIG. 20, when the slit ST is in contact with the second pillar portion HR during etching of the slit ST, an insulating material (e.g., silicon oxide) that constitutes the second pillar portion HR is also etched. Here, when voids V are formed in the second pillar portions HR that have been formed by the CVD process, as illustrated in FIG. 20, the voids V may be in communication with the slit ST. When this happens, because the slit ST is filled later with the insulating film PPI and then the electrically conductive portion PPC, the conductive material constituting the electrically conductive portion PPC may break into the voids V within the second pillar portion HR. In this case, a leakage current through the electrically conductive material may be caused between the electrically conductive portion PPC and the electrically conductive layers (12) formed between the insulating layers 11.

As explained above, when a distance between the slit ST and the second pillar portion HR is larger, the vertically adjacent insulating layers 11 are in contact with each other, and thus the electrically conductive layer may be prevented from being formed as above. On the other hand, when a distance between the slit ST and the second pillar portion HR is smaller, the slit ST and the second pillar portion HR may be in contact with each other.

Note that the slit ST tends to have a larger width in the upper portion thereof, and a smaller width in the bottom end not only in the stair area but also in the memory area. Therefore, in the comparative example, the wider portion of the slit ST may be in contact with the first pillar portion CL in the memory area. If the slit ST is in contact with the first pillar portion CL, short circuit or leakage current may be caused between the electrically conductive portion PPC and the silicon film 40 (see FIG. 11, for example) of the first pillar portion CL when the electrically conductive portion PPC is formed in the slit ST.

On the other hand, in the semiconductor storage device 1 and the manufacturing method thereof according to the present embodiment, the insulating layers 11 closer to the base body 10 among the insulating layers 11 cantilevered by the first pillar portions CL (namely, the insulating layers 11 in a portion where the distance between the first pillar portion CL and the slit ST is wider) are supported by the supporting posts SP extending locally into the stacked body SL from the top surface of the base body 10. Therefore, the two vertically adjacent insulating layers 11 cannot be warped or come into contact with each other. Additionally, a distance between the wider portion of the first pillar portion CL and the wider portion of the slit ST is kept so that both are not in contact with each other. Namely, while the vertically adjacent insulating layers 11 are prevented from being in contact with each other by the supporting posts SP, the separating portion PP and the first pillar portion CL (or the second pillar portion HR) can also be prevented from being in contact with each other.

Note that when the number of layers stacked in the stacked body SL is increased, the wider portions of the first pillar portions CL and the separating portions PP (slits ST) tend more likely to be larger, because a time to be spent to etch the stacked body SL to form the through-holes MH and the slits ST is also increased. The distance between the first pillar portion CL and the separating portion PP (slit ST) may become 150 nm to 200 nm in the lower-layer portion of the stacked body SL. Even when there is such a relatively large distance, because the insulating layers 11 in the lower-layer portion of the stacked body SL are cantilevered by the supporting post SP, the contact between the insulating layers 11 may be avoided.

Additionally, from a viewpoint of increasing a memory capacity of the semiconductor storage device 1, the distance may be decreased between the first pillar portion CL and the separating portion PP in the memory area MA, as long as the wider portions of both are not in contact with each other. Therefore, upper end portions of the supporting posts SP may be lower than the largest width portion of the separating portion PP, in order to prevent a distance between the first pillar portion CL and the separating portion PP from being rather wider by the supporting posts SP formed therebetween. Namely, when the supporting pillars SP are provided in areas, lower than the widest portion of the separating portion PP, where a distance between the separating portion PP and the first pillar portion CL is relatively larger, the distance can be prevented from being unnecessarily larger.

Modifications

Figure 21:
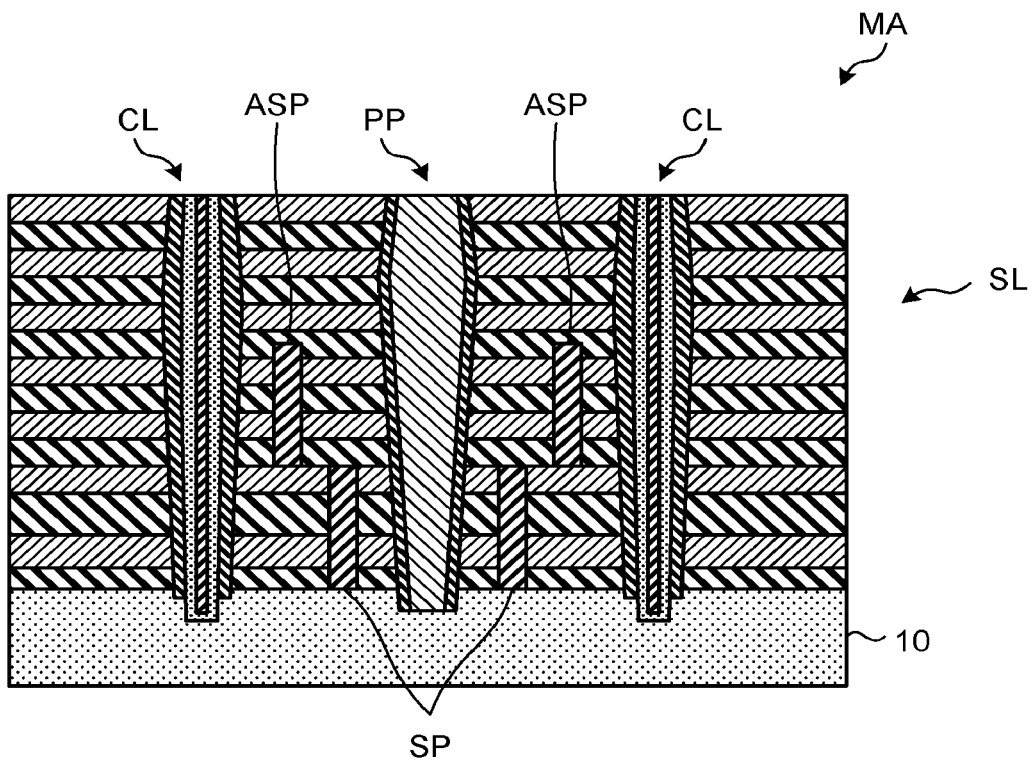
FIG. 21 is a schematic view of another modification of the semiconductor storage device according to the embodiment.

For example, as illustrated in FIG. 21, additional supporting posts ASP may be provided in the memory area MA. The additional supporting posts ASP are seamlessly formed of silicon oxide in the same manner as the supporting posts SP. In the illustrated example, the additional supporting posts ASP extend locally in the stacking direction of the stacked body SL in between the separating portion PP and the first pillar portion CL. Additionally, the additional supporting posts ASP are arranged above and horizontally deviated from the supporting posts SP. Moreover, in the illustrated example, the additional supporting posts ASP are arranged closer to the first pillar portion CL than the separating portion PP. However, without limiting to the illustrated example, the additional supporting posts ASP may be provided spaced from, but vertically aligned with the corresponding supporting posts SP. Additionally, the additional supporting posts ASP may be deviated horizontally from and overlapped vertically with the corresponding supporting posts SP. Namely, bottom surfaces of the additional post ASP may be lower than the upper surfaces of the supporting posts SP.

As to the supporting post SP, the position, the height, and the width thereof may be determined depending on the number of the insulating layers 11 and the electrically conductive layers 12, the distance between the separating portion PP and the first pillar portion CL, and the like. However, a warpage of the insulating layers 11 of the semiconductor storage device according to the embodiment in production can be further reduced when the additional supporting posts ASP are provided in appropriate positions. Additionally, the separating portions PP (slits ST) and the first pillar portion CL can be prevented from being in contact with each other by providing the additional supporting posts ASP above the supporting posts SP. Note that the leakage current is less likely to be caused even when the additional supporting posts ASP are in contact with the separating portions PP and the first pillar portions CL because the additional supporting posts ASP are formed of an insulating material such as silicon oxide.

Note that the additional supporting posts ASP may be formed by the manufacturing processes described referring to FIGS. 5 to 7, after the supporting posts SP are formed. Additionally, a height, a width (length along the extending direction of the separating portion PP) or the like of the additional supporting posts ASP may also be determined depending on the number of the insulating layers 11 and the electrically conductive layers 12 in the stacked body SL, and a distance between the separating portion PP and the first pillar portion CL, in the same manner as the supporting post SP.

Figure 22:
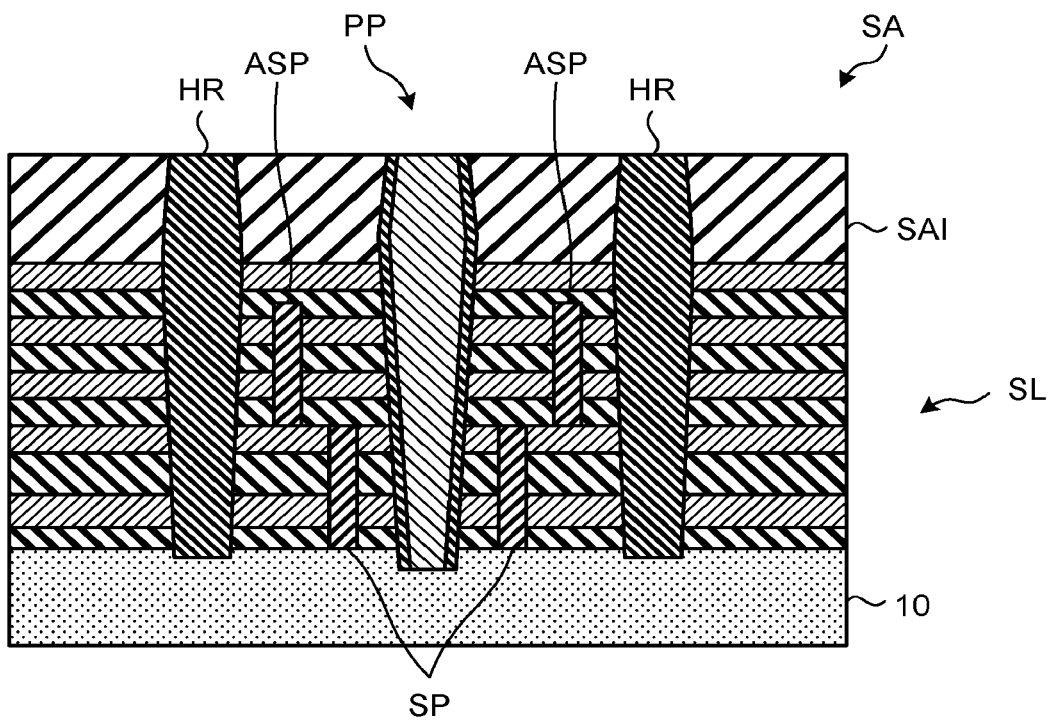
FIG. 22 is a schematic view of yet another modification of the semiconductor storage device according to the embodiment.

Additionally, as illustrated in FIG. 22, the additional supporting posts ASP may also be provided in the stair area SA. As illustrated, the additional supporting posts ASP are arranged above the supporting post SP between the separating portion PP and the second pillar portion HR. Additionally, the additional supporting posts SP are horizontally deviated from the supporting posts SP, and arranged closer to the second pillar portions HR than separating portion PP. By providing the additional supporting posts SP at appropriate positions in the stair area SA, the insulating layer 11 of the semiconductor storage device according to the embodiment in production can be further reduced. Note that the additional supporting posts ASP may be provided in both or either one of the stair area SA and the memory area MA.

Additionally, after having formed the memory film 30 inside the through-hole MH (FIG. 9), a bottom surface portion of the memory film 30 is removed, and then the silicon film 40 is formed therein (FIG. 10) in the manufacturing method according to the above-described embodiment. However, a silicon thin film may be formed as a protection layer in the inner side surface and the bottom surface of the memory film 30 after the memory film 30 is formed. In this case, the silicon film 40 is formed after a bottom surface portion of the silicon thin film and a bottom surface portion of the memory film 30 are removed. According to this, when the bottom surface portion of the memory film 30 is removed, the memory film 30 is prevented from being exposed to active species within the etching gas by the silicon thin film.

Additionally, although the second pillar portions HR are formed separately from the first pillar portions CL in the manufacturing method according to the above-mentioned embodiment, the second pillar portions HR may be formed simultaneously with the first pillar portions CL. Namely, holes for the second pillar portions HR may be formed when the through-holes MH are formed, and the memory film 30, the silicon film 40, and the core film 50 may also be filled into the holes for the second pillar portions HR when the films 30, 40, 50 are filled into the through-holes MH to form the first pillar portions CL. In this case, the silicon films 40 inside the second pillar portions HR are not necessarily in contact with the base body 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a stacked body in which a plurality of insulating layers and a plurality of electrically conductive layers are stacked alternately one on another, the stacked body being provided on a predetermined electrically conductive film;
   a first pillar portion wherein a plurality of memory cells are formed, the first pillar portion penetrating through the stacked body in a stacking direction of the stacked body;
   a first separating portion that separates the stacked body into a plurality of blocks;
   a first supporting post that extends locally within the stacked body from an upper surface of the predetermined electrically conductive film in the stacking direction; and
   a second supporting post spaced from the predetermined electrically conductive film, the second supporting post extending locally within the stacked body between the first pillar portion and the first separating portion, the second supporting post being deviated from the first supporting post in a direction intersecting the stacking direction.

* * * * *